(12) United States Patent
Limb

(10) Patent No.: US 7,842,521 B2
(45) Date of Patent: Nov. 30, 2010

(54) EDGE EXCLUSION ZONE PATTERNING FOR SOLAR CELLS AND THE LIKE

(75) Inventor: Scott J. Limb, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 12/169,564

(22) Filed: Jul. 8, 2008

(65) Prior Publication Data

US 2010/0009472 A1 Jan. 14, 2010

(51) Int. Cl.
H01L 21/66 (2006.01)
(52) U.S. Cl. .............................. 438/16; 438/7; 438/692; 257/E21.219
(58) Field of Classification Search .................... 438/7, 438/692, 12–16; 257/E21.219
See application file for complete search history.

(56) References Cited

U.S. PATENT DOCUMENTS

| 5,699,260 | A * | 12/1997 | Lucas et al. ................. 700/121 |
| 6,317,846 | B1 * | 11/2001 | Higgins et al. ................. 714/30 |
| 6,921,672 | B2 * | 7/2005 | Satya et al. .................... 438/18 |
| 7,074,710 | B2 | 7/2006 | Whitefield et al. |
| 2003/0139048 | A1 * | 7/2003 | Wong et al. .................. 438/692 |
| 2008/0309927 | A1 * | 12/2008 | Grueneberg ............. 356/237.1 |

OTHER PUBLICATIONS

Van Kerschaver, Emmanuel and Guy Beaucarne, Back-contact Solar Cells: A Review, Prog. Photovolt: Res. Appl. 2006; 14:107-123, Published online Dec. 20, 2005 in Wiley InterScience (www.interscience.wiley.com). DOI: 10.1002/pip.657.

J. Coello, S. Pumar, I. Tobias, C. del Cafiizo, A. Luque, Data acquisition and interpretation of lifetime measurements, publication and date unknown.

Kenta Nakayashiki, Vichai Meemongkolkiat, and Ajeet Rohatgi, Effect of Material Inhomogeneity on the Open-Circuit Voltage of String Ribbon Si Solar Cells, IEEE Transactions on Electron Devices, vol. 52, No. 10, Oct. 2005.

Ronald A. Sinton, Predicting Multi-Crystalline Solar Cell Efficiency From Lifetime Measured During Cell Fabrication, Proceedings of the 3rd World Conference on Photovoltaic Energy Conversion, May 11-18, 2003 Osaka, Japan, pp. 1028.

Rita Ebner et al., Metal Fingers on Grain Boundaries in Multicrystalline Silicon Solar Cells, Prog. Photovolt: Res. Appl; 11, pp. 1-13 (date unknown).

(Continued)

*Primary Examiner*—William M Brewster
*Assistant Examiner*—Wilner Jean Baptiste
(74) *Attorney, Agent, or Firm*—Jonathan A. Small

(57) ABSTRACT

The edge profile (and optionally the physical and electrical characteristics) of a wafer is determined. Useful regions of the wafer in an edge exclusion zone may then be identified. A customized grid array layout is created specific to that wafer from an analysis of the edge profile, for example having a grid array with interconnection lines located within the useful portions of the edge exclusion zone. This working file is then used by a system, such as a digital lithography system, to form the grid array on the surface of the wafer. The grid array is specific to that wafer. Various aspects of the grid array may also be controlled in the process. For example, the line width, inter-line spacing, and position of the lines comprising the grid array are configurable on a wafer-by-wafer basis.

19 Claims, 5 Drawing Sheets

OTHER PUBLICATIONS

G. Hahn and A. Schonecker, New crystalline silicon ribbon materials for photovoltaics, J. Phys.: Condens. Matter 16 (2004) R1615-R1648.

U. Ganopadhyay, H. Saha, S.K. Dutta, Kyunghae Kim, K. Chakrabarty, and Junsin Yi, Front Grid Design for Plated Contact Solar Cells, IEEE publication (unknown) 2002.

Verlinden et al., Backside Contact SiliconSolar Cells with Improved Efficiency for the '96 World Solar Challenge, publication and date unknown.

Burkeen et al., Visualizing the Wafer's Edge, KLA-Tencor Yield Management Solutions Magazine, Spring 2007, pp. 18-20.

* cited by examiner

EDGE EXCLUSION ZONE PATTERNING FOR SOLAR CELLS AND THE LIKE

BACKGROUND

The present invention is related to methods for producing the printed pattern of interconnection lines of wafers such as semiconductor wafers used for photovoltaic (solar) cells and the like.

There exist today a very wide variety of devices whose starting point is a wafer substrate. For example, integrated circuit devices are often formed on thin, circular silicon wafers on which a pattern of various materials have been formed. A large number of other discrete and integrated devices are similarly produced by forming patterns of materials on wafer substrates. Similarly, certain forms of the ubiquitous disk drive begins with a platter on which a pattern of features are formed (such as texture bumps to reduce stiction and the like).

One type of device formed from a patterned substrate is a photovoltaic cell. A subset of these devices are those which generate a current using sunlight, or solar cells, which are of particular interest today as a source of environmentally conscious energy generation. In the present disclosure we focus on the manufacturing process and design of such solar cells, although it will be appreciated that this is but one example of the types of devices, wafer processes, and wafer designs to which the present disclosure is addressed.

One example of a modern solar cell is formed of a body, typically silicon, in which a p-n junction diode is formed (e.g., by diffusion of an n+ dopant into a surface of the p-type body). In operation, a photon absorbed by the body (e.g., from sunlight) "excites" an atom of the body material causing an increase in the energy of an electron of that atom. This increase in energy moves the electron into the conduction band, where it is free to move around within the semiconductor. The vacancy left by the now-mobile electron is called a hole. The negative charge of the electron causes it to flow in one direction within the body (e.g., toward the n-type region), and the positive charge of the hole causes it to flow in the opposite direction (e.g., toward the p-type region). An array of grid lines (parallel lines and/or intersecting lines) are formed on a surface of the body to permit the collection of the mobile electrons or holes, thereby permitting extraction of a direct current. In some cases, contact pads are provided as terminations for the lines in order to provide a convenient mechanism for connection of the solar cell to external circuitry.

While there are a number of popular solar cell designs on the market today, they generally have in common the grid array on one surface of the body. (As used herein, the term "grid array" shall denote parallel line, intersecting line, and both parallel and intersecting line embodiments.) The surface of the body can either be the "frontside" or "backside", where the frontside is that surface exposed to sun and the backside is the side opposite the frontside. For efficient operation of all solar cell designs it is desired to provide a relatively large area within which photons may be absorbed. The electrons and holes generated by the photons cannot travel far without recombining (producing no useful current). Therefore, the grid array must be in electrical contact with (i.e., cover) a significant portion of the body surface. In addition, the lines must have sufficiently low resistivity and a sufficient cross-sectional area to carry the generated current. Too high the cross sectional resistance and the current is attenuated.

According to one solar cell design referred to as a backside contact design, emitter regions are formed in the bulk body proximate the backside of the body. Base and emitter contacts are then formed on the backside, with the emitter contacts in electrical contact with the emitter regions in the body. In a variation of this design, referred to as the metallization wrap-through back contact cell design, the emitter remains near the frontside of the body, but part of the front metallization grid is moved from the front to the rear surface, and the remaining front surface grid is connected to the interconnection pads on the rear surface by extending it though a number of vias formed in the body. In either backside embodiment, however, there is a desire to provide as many base-emitter pair as possible in order to obtain the current from the cell.

Typically, in any process which covers a wafer in a metal film or deposits a patterned layer over the wafer, deposition or patterning up to the edge of a wafer is problematic due to wafer size variations, wafer quality at its edge, and particularly for patterning, screen printing tolerances, screen stretch, etc. Most processes impose a limit on how close to the wafer edge a process may pattern the wafer surface. Width of such a region, called an edge exclusion zone, varies based on process, material being deposited, wafer material, etc., but a typical design limitation is an edge exclusion zone on the order of 1 mm wide.

One key reason for the edge exclusion zone is that wafers vary in size, edge quality, etc. from wafer to wafer. It is possible to increase the consistency of the wafers and the quality of the wafer edges from wafer to wafer, but doing so increases wafer cost significantly. The solar cell industry, and indeed many wafer-based industries, are very sensitive to cost increases. Therefore, there is a need to provide a reduction in the edge exclusion zone (i.e., provide increased usable wafer area) without materially increasing cost.

Features patterned onto the surface of a body of the type discussed above are often produced by a screening method. According to such methods, there is a minimum feature size limitation imposed by the limits of the screening process. Furthermore, the surface area of the body on which features may be printed is limited by the edge exclusion zone design rule. Therefore, to date there has been a limit on the total number of base-emitter feature pairs that may be present on a solar cell, which works against the desire to maximize the number of such feature pairs in order to maximize the output efficiency of the solar cell.

In fact, in most wafer-based structures, there is a desire to utilize as much of the wafer surface as possible. The edge exclusion zone rule typically is imposed on any such wafer-based structure. Therefore, the desire to find more useable surface area for example in the edge exclusion zone has applicability outside the field of solar cells.

SUMMARY

Accordingly, disclosed herein are systems and methods for examining the edge exclusion zone and providing unique grid array layouts on a wafer-by-wafer basis which permit use of all useable wafer surface area within that edge exclusion zone. Such a system and method automatically and efficiently takes into account variations in the edge profile and/or edge quality of wafers in a manufacturing line, and is particularly well suited for many fields of use, such as the manufacture of solar cells. The systems and methods disclosed herein may be optimized around one or more aspects of the solar cell, such as maximizing current output, maximizing photon absorption, minimizing cost, combinations of such aspects, etc.

According to one aspect of the disclosure the edge profile of each wafer is determined, for example by optical measurement. A customized grid array layout is then created for each specific wafer from an analysis of the edge profile, for example having a grid array of interconnection lines located as close to the wafer edge as possible. This working file is then used by a system for forming the grid array on a wafer-by-wafer basis, such as a digital lithography system, to produce a grid array on the surface of the wafer. The grid array is specific to that wafer. Various aspects of the grid array may be controlled in the process. For example, the number of features in the grid array, the size (e.g., line width) of the features, spacing between features, and position of the features comprising the grid array are configurable on a wafer-by-wafer basis.

According to a variation of the above aspect, the digital lithography system may use the layout to directly print a grid array on the surface of the body, or may alternatively print a mask structure used by a plating method, screening method, photo lithography method, etc. as an intermediate step in the production of the grid array.

The present disclosure provides a unique grid array layout for a wafer taking into account the specific dimensions, quality, etc. of that wafer, and employs a deposition process which is controllable from one wafer to another to realize that layout. One of a number of different aspects of the layout can be adjusted based on the wafer measurement. For example, additional P+ and N+ regions, contacts, and gridlines of a set pattern (line width, pitch) can be added into what previously was reserved as the edge exclusion zone. Alternatively, the pitch of a set pattern may be increased to push lines out into what previously was reserved as the edge exclusion zone. Still further, the position of the grid array can be shifted, in part or in its entirety, such that lines may then reside in what previously was reserved as the edge exclusion zone. Any of the above can be varied on a region-by-region basis in a grid array layout, taking advantage of the ability to locate lines in what previously was reserved as the edge exclusion zone. Finally, any or all of the above can be combined in a grid array layout, taking advantage of the ability to locate lines in what previously was reserved as the edge exclusion zone.

The above is a summary of a number of the unique aspects, features, and advantages of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings:

FIG. 1 is a flow diagram illustrating one embodiment of a method for edge exclusion zone patterning for solar cells and the like.

DETAILED DESCRIPTION

Figure 1:
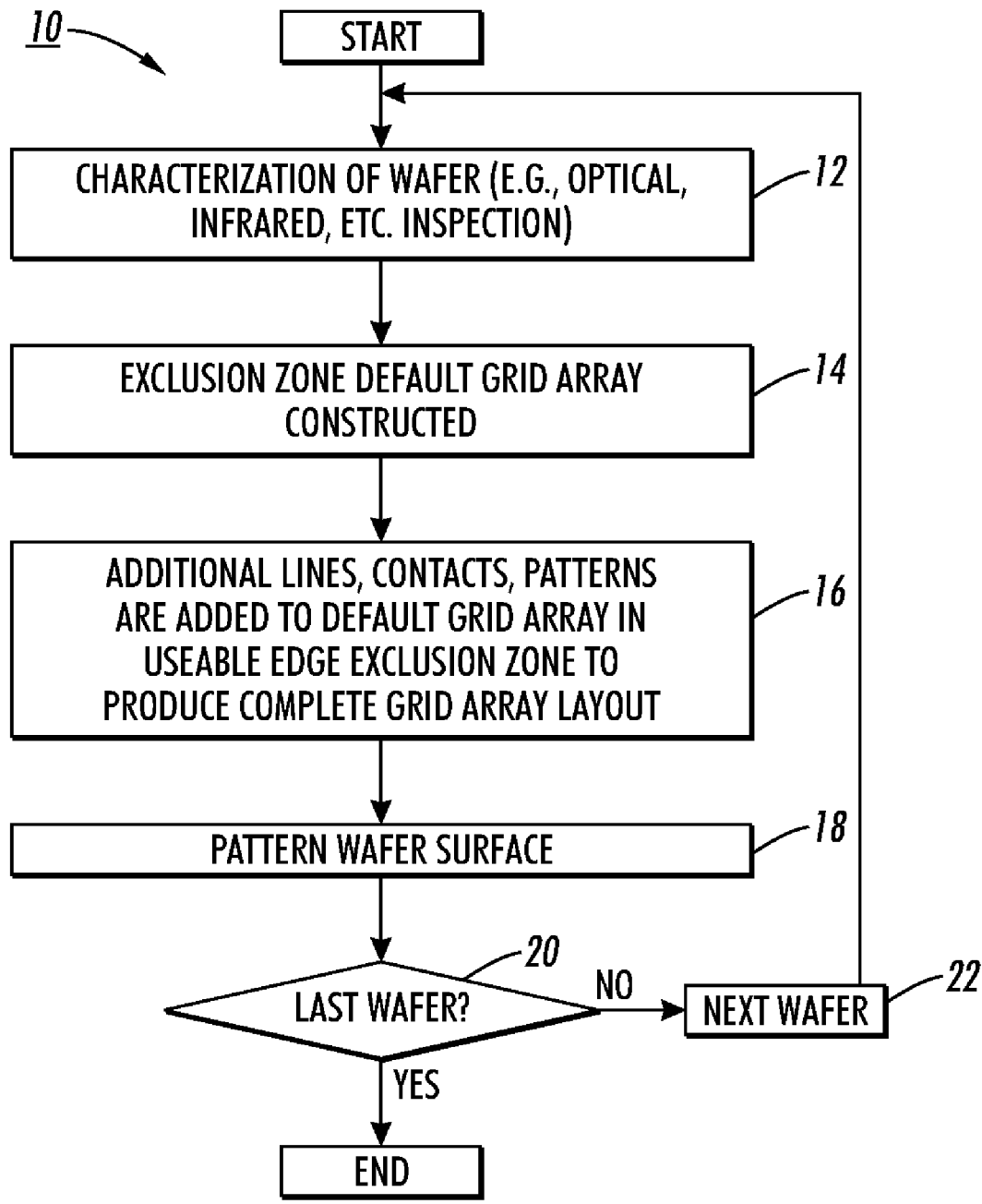

The present disclosure takes advantage of a process for in situ formation or masking of wafer-level structures, and effectively uses measurements of the wafer edge (and possibly other portions of the wafer) to print a grid array on the wafer reaching the limits of the wafer edge, in a pattern unique to that wafer. One example of a formation or masking process which allows for a wafer-by-wafer patterning, and which is therefore well suited as an element of an embodiment of the present disclosure is known as digital lithography. Another example is laser direct imaging.

Digital lithography is a maturing technology designed to reduce the costs associated with photolithographic processes, used often in the fabrication of micro-electronic devices, integrated circuits, and related structures. Digital lithography directly deposits patterned material onto a substrate in place of the delicate and time-consuming photolithography processes used in conventional manufacturing processes. The printed pattern produced by digital lithography can either comprise actual device features (i.e., elements that will be incorporated into the final device or circuitry, such as electrical interconnection lines, contact pads, the source, drain, and gate regions of thin film transistors, opto-electronic device components, etc.) or it can be a mask for subsequent semiconductor processing (e.g., etch, implant, plating, deposition, etc.) Importantly, unlike traditional lithographic systems, digital lithography systems avoid the cost and challenges associates with the use of reticles or masks while at the same time provide great flexibility in varying the printing from one device to the next.

Typically, digital lithography involves depositing a print material by moving a print head and a substrate relative to one another along a single axis (the "print travel axis"). Print heads, and in particular, the arrangements of the ejectors incorporated in those print heads, are optimized for printing along this print travel axis. Printing takes place either in a raster fashion, with the print head making "printing passes" across the substrate as the ejector(s) in the print head dispense individual "droplets" of print material onto the substrate or in a single pass mode if the ejector spacing is smaller than the critical dimension. Typically, the print head moves relative to the substrate in each printing pass, but the equivalent result may be obtained if the substrate is caused to move relative to the print head (for example, with the substrate secured to a moving stage) in a printing pass. At the end of each printing pass, the print head (or substrate) makes a perpendicular shift relative to the print travel axis before beginning a new printing pass. Printing passes continue in this manner until the desired pattern has been fully printed onto the substrate.

Materials typically printed by digital lithographic systems include phase change material and solutions of polymers, colloidal suspensions, such suspensions of materials with desired electronic properties in a solvent or carrier. For example, U.S. Pat. Nos. 6,742,884 and 6,872,320 (each incorporated herein by reference) teach a system and process, respectively, for printing a phase change material onto a substrate for masking. According to these references, a suitable material, such as a stearyl erucamide wax, is maintained in liquid phase over an ink-jet style piezoelectric print head, and selectively ejected on a droplet-by-droplet basis such that droplets of the wax are deposited in desired locations in a desired pattern on a layer formed over a substrate. The droplets exit the print head in liquid form, then solidify after impacting the layer, hence the material is referred to as phase-change.

Once dispensed from an ejector, a print material droplet attaches itself to the substrate through a wetting action, then proceeds to solidify in place. In the case of printing phase-change materials, solidification occurs when a heated and liquefied printed droplet loses its thermal energy to the substrate and/or environment and reverts to a solid form. In the case of suspensions, after wetting to the substrate, the carrier most often either evaporates leaving the suspended material on the substrate surface or the carrier hardens or cures. The thermal conditions and physical properties of the print material and substrate, along with the ambient conditions and nature of the print material, determine the specific rate at which the deposited print material transforms from a liquid to a solid, and hence the height and profile of the solidified deposited material.

If two adjacent droplets are applied to the substrate within a time prior to the solidification of either or both droplets, the droplets may wet and coalesce together to form a single, continuous printed feature. Surface tension of the droplet material, temperature of the droplet at ejection, ambient temperature, and substrate temperature are key attributes for controlling the extent of droplet coalescence and lateral spreading of the coalesced material on the substrate surface. These attributes may be selected such that a desired feature size (e.g., width) may be obtained.

Now, with reference to FIG. 1, a first embodiment of a method 10 for wafer-specific line patterning for solar cells and the like according to the present disclosure begins with the step 12 of examining and measuring a wafer which is to be formed into a solar cell. It will be appreciated that the wafer may be of virtually any material such as single-crystalline silicon (c-Si), multi-crystalline silicon (m-Si), amorphous silicon (a-Si), as well as a material other than silicon. Typically, wafers are circular in plan view, and very thin relative to their diameter, but such need not be the case. Accordingly, the present disclosure shall not be interpreted to be limited to such a starting material. Furthermore, while there are many preliminary steps in the preparation of a wafer for processing into a solar cell, we focus here only on those steps affected by the present disclosure.

Whatever the material and shape of the wafer, the characterization of the wafer at step 12 is performed to determine precise dimensions at least at the wafer edge. The method of characterization may be selected from any of a variety of analysis method such as optical, infra-red or similar, reflection, transmission, scattering and/or phase shift techniques or combinations of same, combined with an analysis program for determining the profile of the wafer's edge. This profile reflects the actual edge location, for example with reference to a fiducial mark on the wafer surface. It may also reflect the topography (e.g., roll-off, blisters, delaminations, chips, and other defects and limitations) at the edge of the wafer.

According to one embodiment, the material characteristics (e.g., the physical and electrical properties, grain structures, presence of impurities, etc.) in the exclusion zone of the wafer are also determined and taken into account. Methods for determining these characteristics include (but are not limited to) optical inspection for grain boundaries, surface photovoltage measurement for sheet resistance variations, photovoltage measurement for bulk resistance variations, microwave photoconductive decay measurements for region lifetimes, etc. Such methods are discussed in further detail in U.S. patent application Ser. No. 12/169,377, which is incorporated herein by reference.

Figure 2A:
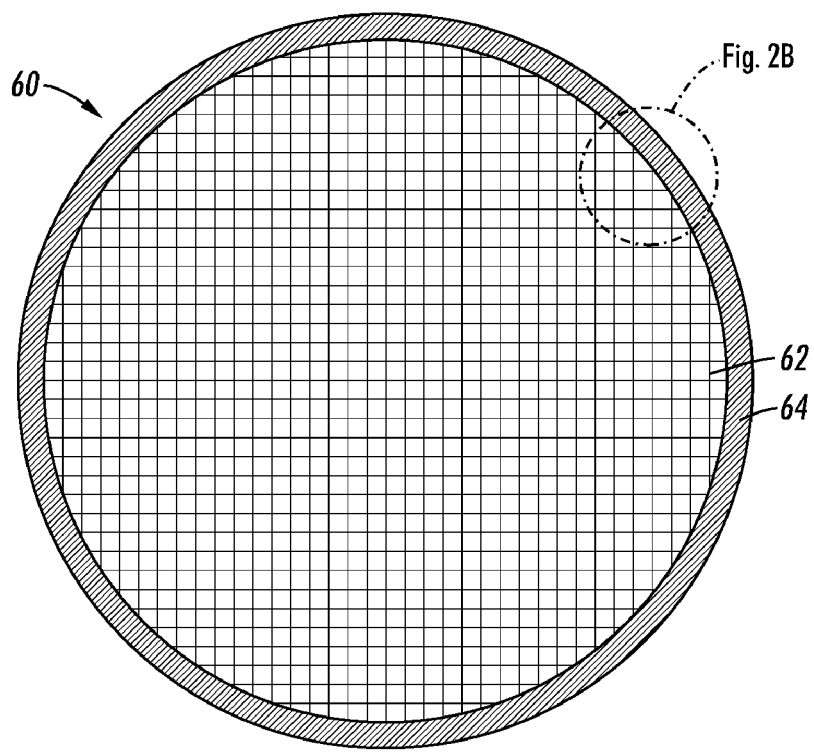
FIG. 2A is a plan view of a wafer, useful for example as a solar cell, having an idealized wafer edge with no chips, delaminations, impurities, etc.
Figure 2B:
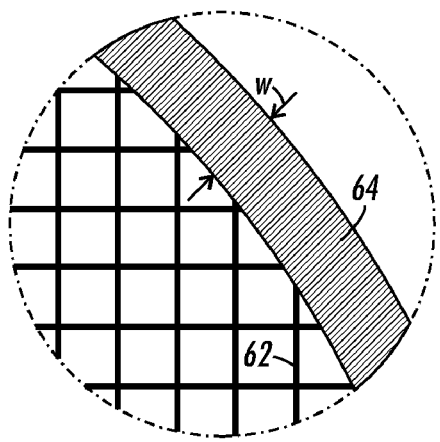
FIG. 2B is a close-up view of a portion of the wafer edge of the wafer shown in FIG. 2A.
Figure 3A:
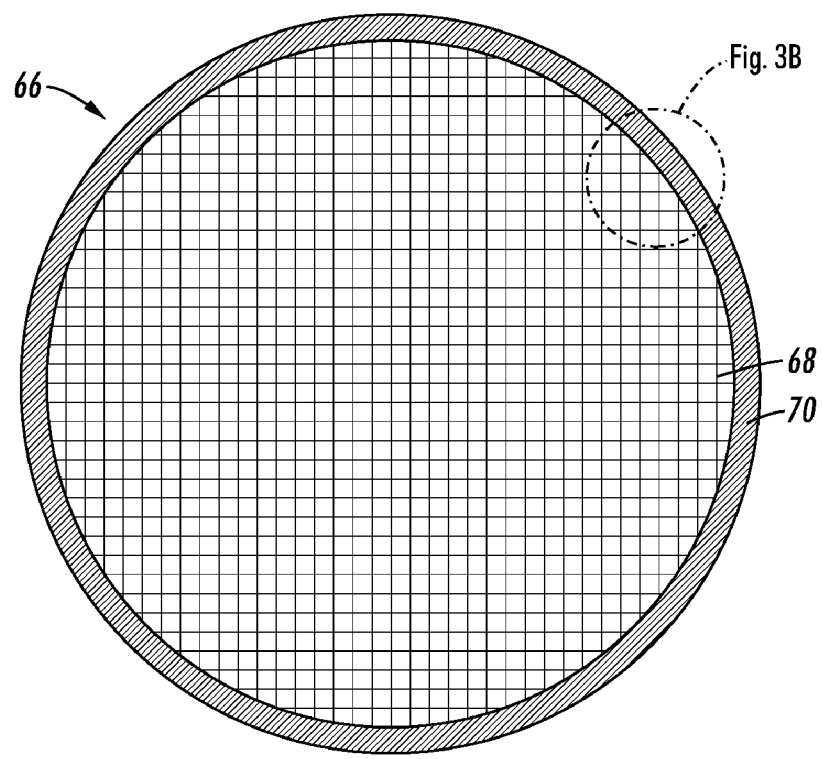
FIG. 3A is a plan view of a wafer, useful for example as a solar cell, having a more commonly observed wafer edge, illustrating chips, delaminations, impurities, etc.
Figure 3B:
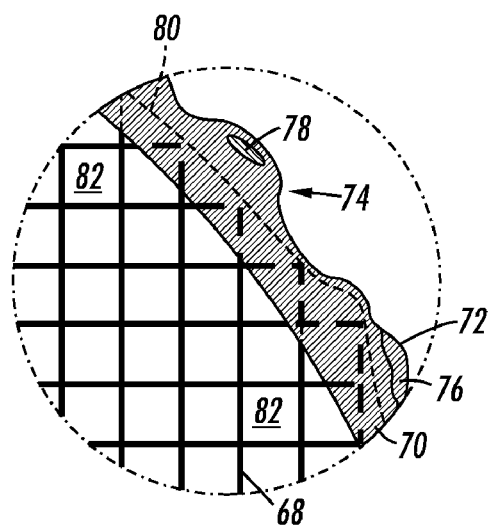
FIG. 3B is a close-up view of a portion of the wafer edge of the wafer shown in FIG. 3A.

With reference to FIGS. 2A and 2B, there is shown therein an ideal wafer 60 obeying an exclusion zone design rule. Wafer 60 has formed thereon a plurality of gridlines 62 up to a limit near the wafer's edge. The exclusion zone 64 is a band extending from the wafer's edge radially inward a distance w. However, the outer edge of a wafer is typically relative rough at the scale of the lines or other features patterned on the surface of the wafer. Thus, with reference to FIGS. 3A and 3B, a more realistic wafer 66 is illustrated. Again, wafer 66 includes a plurality of gridlines 68 and an exclusion zone 70. As illustrated, the outer edge 72 of the wafer presents chips 74, regions of nonplanarity 76, regions of contamination or impurity 78, etc. Due to such imperfections, patterning in the edge exclusion zone may result in unreliable or non-functioning electrical interconnections or devices.

Due to the batch nature of common wafer processing (e.g., current solar cell manufacturing), in the prior art there is a need to assume a worst-case scenario, and avoid any patterning within the edge exclusion zone so that the patterned elements are highly likely to be functional. However, in many instances this results in unused regions of a wafer which are in fact functional. For example, for wafer 66, the region from line 80 to the radially innermost boundary of the exclusion zone 70 is free of problematic defects and therefore useful (areas radially outward therefrom would generally be considered not useful, but the granularity of this characterization is a matter of implementation of the present disclosure).

By determining the extent to which it is safe to pattern within the exclusion zone, and making those previously unavailable regions available for patterning, additional features may be patterned. In so doing, additional base-emitter pairs are created, thereby increasing the efficiency of the final solar cell (i.e., providing an increase in current output per unit area of the solar cell).

Returning to FIG. 1, it is therefore the goal of step 12 to essentially create a map of the wafer's edge so that a layout of line patterns can maximize the available wafer surface on a wafer-by-wafer basis.

According to one embodiment of the present invention, once the characteristics of the wafer edge are determined, a grid line layout obeying a standard exclusion zone design rule (e.g., 1 mm exclusion zone) is prepared for the wafer at step 14. In many instances, the examination and measuring of the wafer at step 12 will reveal regions of the wafer in the exclusion zone which in fact are able to accommodate additional grid lines (or other features). Accordingly, at step 16 the exclusion zone is considered in light of the examination and measurement of the wafer edge, and where there is adequate space, and where the design rules otherwise permit, additional features such as base-emitter contacts (lines), and the like are added to the layout therein to form the complete grid layout for the wafer.

Alternatively, the pitch of a set pattern may be increased in one or more directions to push lines out into the useful regions of what previously was reserved as the edge exclusion zone. In another alternative, the position of the grid array can be shifted, in part or in its entirety, such that lines may then reside in what previously was reserved as the edge exclusion zone. Still further, any of the above can be varied on a region-by-region basis in the grid array layout, and any or all of the above can be combined in the grid array layout, taking advantage of the ability to locate lines in what previously was reserved as the edge exclusion zone. Again, this is done on a wafer-by-wafer basis, taking into account the unique edge profile of each wafer.

Once the complete grid layout is developed, the wafer surface may be patterned. As each wafer has a unique layout, a process is required which is capable of applying a first pattern to a first wafer, a second pattern different than the first to a second wafer, and so on. To this end, digital lithography is one process meeting this requirement. Volume manufacturing is an important part of the economy of scale for solar cells. Therefore, according to one embodiment, a production line is provided in which, under computer control, wafers are characterized, the layouts prepared, then the wafers prepared and patterned according to a digital lithographic process on a wafer-by-wafer basis.

Figure 4:
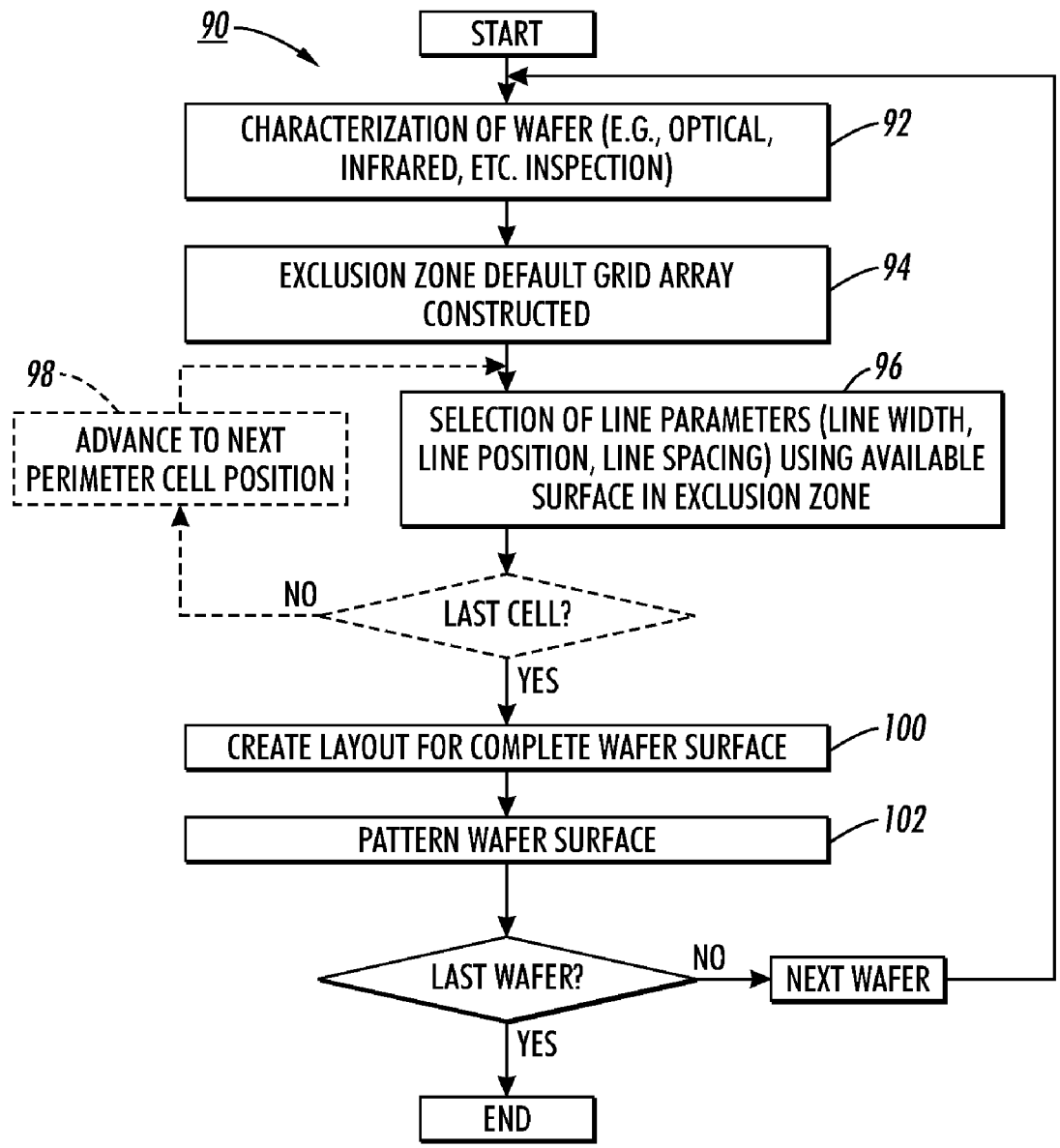
FIG. 4 is a flow diagram of an alternate embodiment of a method for edge exclusion zone patterning for solar cells and the like which accommodates non-uniform cell sizes and which examines the wafer on a cell-by-cell basis.

According to one embodiment of the present invention the grid 62, 68 (FIG. 2, FIG. 3) is comprised of regularly spaced features (such as lines) creating an array of uniform cells (e.g., feature pairs) over the wafer surface. According to another embodiment, the feature size, placement, spacing, etc. may vary according, for example, to the characteristics of the material comprising the wafer. This results in a layout of an array of cells of varying size and location over the surface of the wafer. A system and method for creating such a layout is disclosed in the aforementioned U.S. application Ser. No. 12/169,377. Utilization of the useful wafer surface within the exclusion zone has applicability in both embodiments. In the embodiment in which grid size is uniform, the system will determine whether the standard cell size fits within an available region of the exclusion zone. If so, it will be added to the default grid array at step 16 (FIG. 1). In the embodiment in which pitch is permitted to vary, the system will locate the features so as to maximize the additional available wafer surface within the exclusion zone, which may include varying the pitch of all features on the grid array or just the pitch of those features in the edge exclusion zone. In either case, it may be necessary to evaluate the wafer surface on a cell-by-cell basis and form the features taking into account their width and spacing as well as their local position, as described in the aforementioned U.S. application Ser. No. 12/169,377. A method for realizing this embodiment is illustrated in FIG. 4.

Figure 6:
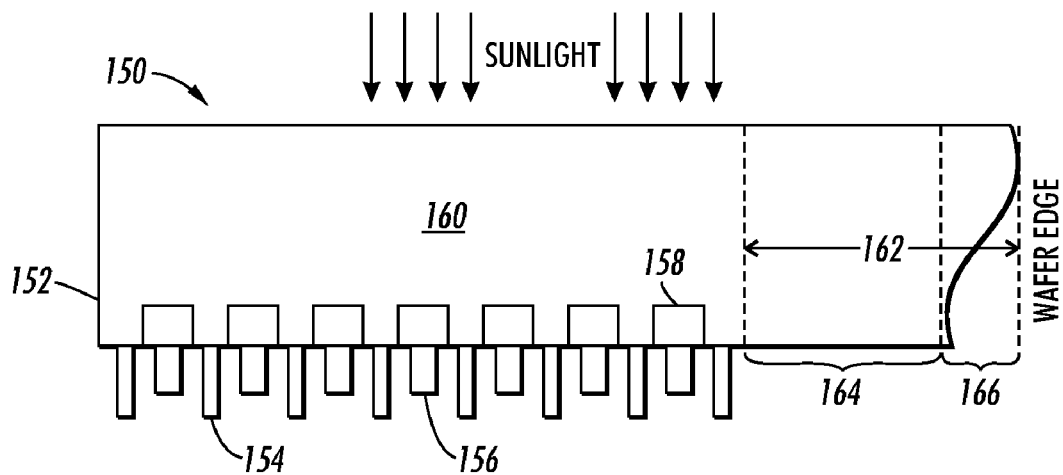
FIG. 6 is a cut-away side view of a solar cell illustrating an array of lines which form base and emitter contacts in a backside solar cell design.

With reference to FIG. 6, there is shown therein a cut-away side view of a backside contacts solar cell 150. Formed on the backside 152 of solar cell 150 are an array of lines which form base contacts 154 (on p+ regions) and emitter contacts 156 (on n+ regions) which are in electrical contact with emitter regions 158 formed in the body 160 (e.g., p-type) of cell 150. As can be seen, the pitch (spacing) between base-emitter pairs is smaller than the width of the edge exclusion zone 162. Therefore, if it were possible to reclaim some of the edge exclusion zone, for example region 164 (region 166 having previously been determined to be unavailable for additional feature patterning), it would be possible to form additional base-emitter pair(s) in that reclaimed surface area.

While a plurality of preferred exemplary embodiments have been presented in the foregoing detailed description, it should be understood that a vast number of variations exist, and these preferred exemplary embodiments are merely representative examples, and are not intended to limit the scope, applicability or configuration of the disclosure in any way. Various of the above-disclosed and other features and functions, or alternative thereof, may be desirably combined into many other different systems or applications.

Figure 5:
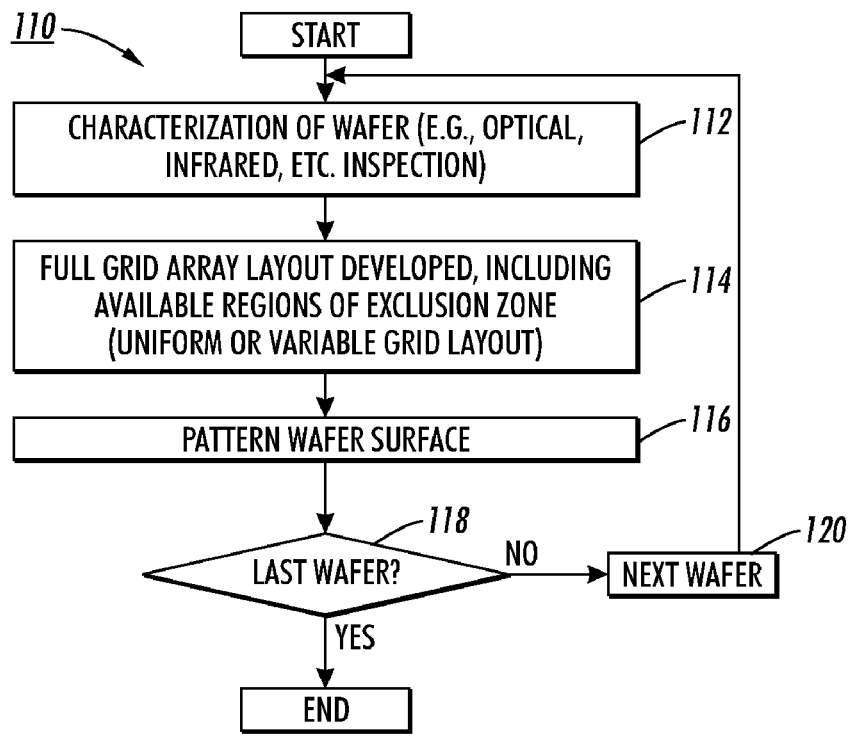
FIG. 5 is yet another flow diagram of an alternate embodiment of a method for edge exclusion zone patterning for solar cells and the like which does not begin with a default layout, but rather generates a layout ab initio from wafer characterization.

For example, the description above has focused on layout procedures utilizing an edge exclusion zone rule. However, it will be appreciated that the present invention is equally applicable in systems without such a design rule limitation, permitting an evaluation on a wafer-by-wafer basis and optimization of the useful surface area of each wafer. In addition, the above description has assumed that a standardized layout is first developed for a wafer, then additional lines, features, etc. added to the standardized layout after considering the characterization of the wafer edge. However, as illustrated in FIG. 5, it is within the scope of the present disclosure that a grid array layout be developed ab initio from the characterization of a region proximate the wafer edge (or entire wafer surface), taking into account imperfections in that region and thereby maximizing use of the wafer surface and hence overall efficiency of the solar cell.

Furthermore, the description above has been in terms of the field of solar cells. However, the present invention is equally applicable to any field in which patterning is applied to the surface of a wafer, such as discrete device and integrated circuit production, disk-based magnetic recording, etc. In addition, various presently unforeseen or unanticipated alternatives, modifications, variations, improvements therein or thereon, and fields of use of the present disclosure may be subsequently made by those skilled in the art which are also intended to be encompassed by the claims, below.

Therefore, the foregoing description provides those of ordinary skill in the art with a convenient guide for implementation of the disclosure, and contemplates that various changes in the functions and arrangements of the described embodiments may be made without departing from the spirit and scope of the disclosure defined by the claims thereto.

What is claimed is:

1. A method for automatically patterning the surfaces of a plurality of wafers comprising:
   preparing a first wafer for patterning;
   measuring said first wafer to determine the characteristics of said first wafer in a region proximate the first wafer's edge;
   characterizing portions of said region proximate the first wafer's edge as either useful or not useful based upon said measuring;
   producing a first pattern layout of pattern features which includes features in portions of said region proximate the first wafer's edge characterized as useful and which does not include features in portions of said region proximate the first wafer's edge characterized as not useful;
   patterning said first wafer based on said first pattern layout;
   preparing a second wafer for patterning;
   measuring said second wafer to determine the characteristics of said second wafer in a region proximate the second wafer's edge;
   characterizing portions of said region proximate the second wafer's edge as either useful or not useful based upon said measuring;
   producing a second pattern layout of pattern features which includes features in portions of said region proximate the second wafer's edge characterized as useful and which does not include features in portions of said region proximate the second wafer's edge characterized as not useful;
   patterning said second wafer based on said second pattern layout;
   wherein said first pattern and said second pattern are different.

2. The method of claim 1, wherein said patterning of said first and second wafers is accomplished by a digital lithographic process.

3. The method of claim 2, wherein said digital lithography deposits, on a droplet-by-droplet basis a mask used for patterning said first and second wafers.

4. The method of claim 2, wherein said digital lithography directly deposits, on a droplet-by-droplet basis, the patterning of said first and second wafers.

5. The method of claim 1, wherein said patterning is performed using laser direct imaging.

6. The method of claim 1, wherein said measuring measures variations in the position of the edge of said first and second wafers and said pattern layout provides features which are positioned in part as a function of the position of the edges of said first and second wafers.

7. The method of claim 1, wherein said measuring measures the topography of said region proximate each said first and second wafer's edges and said pattern layout provides features which are positioned in part as a function of said topography.

8. The method of claim 1, wherein said measuring measures the material characteristics of said region proximate each said first and second wafer's edges and said pattern layout provides features which are positioned in part as a function of said material characteristics.

9. The method of claim 1, wherein producing each said first and second pattern layout comprises, for each of said first and second wafers:
 producing a default layout without regard to the characterization of said region proximate the wafer's edge; and
 selectively adding to said default layout additional features only within portions of said region proximate the wafer's edge characterized as useful.

10. The method of claim 9, wherein said features are interconnection lines having a default pitch, and said additional interconnection lines within said region proximate the wafer's edge have said default pitch.

11. The method of claim 9, wherein said features are interconnection lines having a default pitch, and said additional interconnection lines within said region proximate the wafer's edge have a pitch which varies from said default pitch.

12. The method of claim 1, wherein:
 said features are lines; and
 said producing first and second pattern layouts comprises, for each of said first and second wafers:
  producing a default layout of lines with a default pitch, said default layout produced without regard to the characterization of said region proximate the wafer's edge; and
  selectively increasing said default pitch such that said layout includes lines in said region proximate the wafer's edge in only those portions characterized as useful.

13. The method of claim 1, wherein producing first and second pattern layouts comprises, for each of said first and second wafers:
 producing a default layout without regard to the characterization of said region proximate the wafer's edge; and
 selectively shifting the position of said default layout such that said layout includes features in said region proximate the wafer's edge in only those portions characterized as useful.

14. The method of claim 13, wherein only a portion of the default layout is shifted so that said layout includes features in said region proximate the wafer's edge in only those portions characterized as useful.

15. The method of claim 1, where each said first and second wafer is divided up into a plurality of cells, and further wherein steps of measuring takes place on a cell-by-cell basis for each said wafer.

16. The method of claim 15, wherein said step of producing first and second pattern layouts comprises, for each of said first and second wafers:

producing a layout for each cell on a cell-by-cell basis; and
 producing a layout for each entire wafer by assembling the layout for each cell and adjusting cell layouts to provide electrical continuity between cells where appropriate.

17. A method for automatically patterning the surface of a plurality of wafers, each wafer of a type having a wafer edge, comprising for at least a first and second of said wafers:
 preparing each said wafer for patterning;
 defining an edge exclusion zone proximate each wafer's edge;
 measuring the topography of each said edge exclusion zone and the locations of each said wafer edge relative to a fiducial point on each said wafer;
 characterizing portions of each said edge exclusion zone as either useful or not useful based upon said measuring;
 producing a first layout for said first wafer and a second layout for said second wafer, each layout comprising interconnection lines radially inward and not within each said edge exclusion zone of said first and second wafers, respectively;
 extending at least one of said first and second layouts of interconnection lines such that certain of said lines selectively extend within said edge exclusion zone in portions characterized as useful, said lines not extending within said edge exclusion zone in portions characterized as not useful for said at least one of said first and second wafers; and
 patterning said first and second wafers based on said first and second pattern layouts, respectively;
 wherein said first and second patterns are different.

18. The method of claim 17, further comprising the step of separately measuring the material characteristics of said edge exclusion zone of each wafer, and wherein said producing said first and second layouts of interconnection lines determines said layouts in part as a function of said material characteristics.

19. A method for automatically patterning the surface of a plurality of wafers, each wafer of a type having a wafer edge, comprising for at least a first and second of said wafers:
 preparing each said wafer for patterning;
 defining an edge exclusion zone proximate each wafer's edge;
 measuring the topography of each said edge exclusion zone and the locations of each said wafer edge relative to a fiducial point on each said wafer;
 characterizing portions of each said edge exclusion zone as either useful or not useful based upon said measuring;
 producing a first layout for said first wafer and a second layout for said second wafer, each layout comprising interconnection lines radially inward and not within each said edge exclusion zone;
 adding to at least one of said first and second layout additional interconnection lines such that said additional interconnection lines are added only within said edge exclusion zone in portions characterized as useful for said at least one of said first and second wafers; and
 depositing on said first and second wafers by digital lithography, on a droplet-by-droplet basis, first and second masks used for patterning said first and second wafers, respectively;
 patterning said first and second wafers using said first and second masks; and
 removing said first and second masks;
  wherein said first and second patterns are different.

* * * * *